United States Patent [19]

d'Aragona et al.

[11] Patent Number: 4,818,323

[45] Date of Patent: Apr. 4, 1989

[54] METHOD OF MAKING A VOID FREE WAFER VIA VACUUM LAMINATION

[75] Inventors: Frank Secco, d' Aragona; Hang M. Liaw, both of Scottsdale, Ariz.

[73] Assignee: Motorola Inc., Schaumburg, Ill.

[21] Appl. No.: 66,673

[22] Filed: Jun. 26, 1987

[51] Int. Cl.$^4$ .................. B23K 20/02; B23K 20/24; B23K 35/30

[52] U.S. Cl. ........................... 156/286; 156/305; 156/308.2; 228/179; 228/196; 228/221; 228/228

[58] Field of Search .............. 156/286, 308.2, 312, 156/87, 285, 305, 308.6; 228/179, 196, 221, 228

[56] References Cited

U.S. PATENT DOCUMENTS

| | | | |
|---|---|---|---|
| 2,709,147 | 5/1955 | Ziegler | 228/221 |
| 3,139,680 | 7/1964 | Scuro | 228/221 |
| 3,235,957 | 2/1966 | Horsting | 228/221 |
| 3,769,133 | 10/1973 | Halberschmidt et al. | 156/382 |
| 3,852,136 | 12/1974 | Plumat et al. | 156/286 |
| 4,316,757 | 2/1982 | Walsh | 156/286 |
| 4,357,193 | 11/1982 | McGann et al. | 156/286 |
| 4,388,129 | 6/1983 | Oizumi et al. | 156/286 |
| 4,681,718 | 7/1987 | Oldham | 264/500 |

FOREIGN PATENT DOCUMENTS

| | | | |
|---|---|---|---|
| 2074090 | 10/1981 | United Kingdom | 156/286 |

*Primary Examiner*—Merrell C. Cashion, Jr.
*Attorney, Agent, or Firm*—Joe E. Barbee; Raymond J. Warren

[57] ABSTRACT

A silicon wafer bonding technique is described utilizing low pressures and a dissolvable gas to substantially eliminate voids formed between the bonding surfaces of two wafers.

12 Claims, No Drawings

METHOD OF MAKING A VOID FREE WAFER VIA VACUUM LAMINATION

BACKGROUND

This invention pertains to a wafer bonding method and, more particularly, to a void free wafer bonding method.

In prior art, bonding of two silicon wafers is carried out at atmospheric pressure. Before bonding the wafers are treated with a solution to form hydrophilic surfaces. The wafers are then brought into contact, with polished sides facing each other, under extremely clean environmental conditions. While the wafers do bond together, it has been found that the bonding yields are relatively low since the two bonded wafers are plagued by the presence of areas of poor bond (voids) between them. Evidence indicates that the main reason for the formation of voids is the presence of air between the two bonding surfaces. The air trapped between the two surfaces causes not only a poor contact at room temperature but also a repulsing force between the two bonded wafers at high temperatures. The pressure of the repulsing force is estimated to be 75 psi when the bonding is carried out at 1100 degrees centigrade.

SUMMARY OF THE INVENTION

In view of the foregoing, it is therefore an object of the present invention to provide a new and improved method for bonding wafers.

A further object of the present invention is to provide a substantially voidless wafer-to-wafer bond.

The foregoing objects are achieved in the present invention wherein two silicon wafers are joined in a dissolvable gas environment under atmospheric pressure resulting in voids filled with a dissolvable gas. The wafers are then bonded in a low pressure furnace which creates a suctional force in the voids. Upon heating the wafers to a substantially plastic state under atmospheric pressure, the voids are then collapsed to form voidless bonded wafers.

DESCRIPTION OF THE PREFERRED EMBODIMENT

The current bonding techniques in the literature are carried out at atmospheric pressure. A bonding surface of a first wafer is joined to a bonding surface of a second wafer under atmospheric pressure. This joins the two wafers, but it also can create areas of poor contact (voids) between them.

The first step of the preferred embodiment of the present invention is to provide a proper gas environment so that, in case of void formation between the joined wafers, the voids are filled with a dissolvable gas. This is achieved by joining two wafers under oxygen ambient, instead of air, at atmospheric pressure. Dissolvable gases are certain gases, such as oxygen, which dissolve readily into solid silicon at high temperature. The presence of oxygen alone when the two wafers are joined excludes other gases found in air, such as nitrogen, from being trapped in the voids. Solid solubility of nitrogen in silicon is approximately three orders of magnitude less than that of oxygen.

The second step of the preferred embodiment of the present invention is the formation of a suctional force between the two bonding surfaces of the joined wafers. The joined wafers are placed in a low or reduced pressure furnace. The furnace is then evacuated to a pressure of 0.01 torr or less. Higher pressure may be used, but there is a corresponding reduction in the yield of voidless bonded wafers with increasing pressure. At this low pressure, trapped oxygen is substantially evacuated from the voids. Therefore, the pressure of trapped oxygen between the two bonding surfaces will be reduced to approximately 0.01 torr. The temperature of the furnace is then gradually increased from 350 to about 800 degrees centigrade and is kept at this temperature for a time sufficient to produce a bond, for example, approximately one hour. The gradual increase in temperature allows for some degassing prior to the initial bonding of the wafers. It should be understood that while 800 degrees centigrade is used in this embodiment, any temperature sufficient to produce a bond may be used. At about 800 degrees centigrade the wafers will form a tight bond with approximately 80 to 85% of the surface being bonded. The remaining areas being voids which are completely sealed around. After removal from the low pressure furnace the unbonded regions (voids) of the bonded wafers will still be under suctional force. There are now two wafers bonded together with voids containing very low pressure oxygen.

The next step in the preferred embodiment of the present invention is to transfer the bonded wafers to an atmospheric furnace which is then heated to a reaction temperature of approximately 1000 degrees centigrade or higher and kept there for several hours. Once the wafers are removed from the low pressure furnace the voids between the bonded wafers are under a negative pressure or suction. Since silicon is already in the plastic state at 1000 degrees centigrade the voids are gradually reduced in size and finally disappear, being collapsed by the suctional force inside the voids and the higher pressure outside. The small amount of oxygen present is dissolved into the silicon when heated. Thus, there is nothing inhibiting the complete contacting and bonding of the two wafers. It will be understood by those skilled in the art, that any outside pressure higher than the pressure in the voids, will cause their collapse, although the higher the pressure is, the faster the voids will collapse.

There is thus provided by the present invention a substantially improved wafer bonding method. With a reliable and efficient method for bonding wafers, such as the present invention, a new and more inexpensive way of making dielectrically isolated devices and power device has been found.

Having thus described the invention it will be apparent to those of skill in the art that various modifications can be made within the spirit and scope of the present invention. For example, while oxygen was used in the preferred embodiment as the atmosphere under which the joining of the two wafers is performed, it will be understood by those skilled in the art that other gases which readily dissolve into silicon and are soluble, such as oxygen, may be used. Also, while the use of a readily dissolvable gas provides the best results, the use of vacuum bonding alone with the presence of air in the voids will also increase the percent yield of voidless bonded wafers over prior art methods which don't employ vacuum bonding.

Also, it should be evident to those of skill in the art that a single furnace is capable of performing the void-free bonding provided that the furnace can be operated under low pressure at low temperatures and then operated at high temperatures under higher pressure.

We claim:

1. A method of bonding wafers and removing voids created therebetween comprising the steps of:
   providing a first wafer with a bonding surface;
   providing a second wafer with a bonding surface;
   assembling said bonding surfaces in a dissolvable gas environment under atmospheric pressure;
   reducing the pressure about said first and second wafers;
   heating said first and second wafers creating a bond therebetween defining a void therein, said void containing said dissolvable gas;
   increasing the pressure about said first and second wafers to approximately atmospheric pressure;
   heating said first and second wafers to a reaction temperature below a melting point of said first and second wafers;
   dissolving said dissolvable gas contained in said void into said first and second wafers; and
   eliminating said void.

2. The method of claim 1 wherein said first step of heating said first and second wafers comprises the step of gradually heating said first and second wafers from approximately 350 degrees centigrade to approximately 800 degrees centigrade.

3. The method of claim 2 further comprising the step of heating said first and second wafers at approximately 800 degrees centigrade for approximately one hour.

4. The method of claim 1 wherein said reaction temperature is a temperature of at least approximately 1000 degrees centigrade.

5. A method of bonding wafers and removing voids created therebetween comprising the steps of:
   providing a first wafer with a bonding surface;
   providing a second wafer with a bonding surface;
   assembling said bonding surfaces in a dissolvable gas environment at atmospheric pressure forming assembled wafers;
   reducing the pressure about said assembled wafers to approximately 0.01 torr;
   heating said assembled wafers from approximately 350 degrees centigrade to approximately 800 degrees centigrade thereby creating bonded wafers having a void therein, said void containing said dissolvable gas;
   increasing the pressure about said bonded wafers to approximately atmospheric pressure;
   heating said bonded wafers to a reaction temperature of at least approximately 1000 degrees centigrade;
   dissolving said dissolvable gas contained in said void into said first and second wafers; and
   eliminating said voids.

6. Bonded silicon wafers constructed in accordance with the steps of:
   providing a first silicon wafer with a bonding surface;
   providing a second silicon wafer with a bonding surface;
   assembling said bonding surfaces in an oxygen environment at atmospheric pressure forming assembled silicon wafers;
   reducing the pressure about said assembled silicon wafers to approximately 0.01 torr;
   heating said assembled silicon wafers gradually from approximately 350 degrees centigrade to 800 degrees centigrade thereby created bonded silicon wafers having a void containing said oxygen;
   increasing the pressure about said bonded silicon wafers to approximately atmospheric pressure;
   heating said bonded silicon wafers to at least approximately 1000 degrees centigrade;
   dissolving said oxygen contained in said void into said first and second silicon wafers; and
   collapsing said void due to a low pressure in said void.

7. The method of claim 1 wherein said step of eliminating said void results from collapsing said void due to a low pressure in said void.

8. The method of claim 1 wherein said first and second wafers are silicon.

9. The method of claim 1 wherein said dissolvable gas is oxygen.

10. The method of claim 5 wherein said step of eliminating said void results from collapsing said void due to a low pressure in said void.

11. The method of claim 5 wherein said first and second wafers are silicon.

12. The method of claim 5 wherein said dissolvable gas is oxygen.

* * * * *